(12) United States Patent
Liaw

(10) Patent No.: US 6,398,099 B1
(45) Date of Patent: Jun. 4, 2002

(54) APPARATUS FOR MANUFACTURING PLUG AND METHOD OF MANUFACTURING THE SAME

(75) Inventor: Been-Yu Liaw, Tai-Chung (TW)

(73) Assignee: Unimicron Technology Corp., Ltd., Taoyuan Hsien (TW)

( * ) Notice: Subject to any disclaimer, the term of this patent is extended or adjusted under 35 U.S.C. 154(b) by 4 days.

(21) Appl. No.: 09/621,166

(22) Filed: Jul. 21, 2000

Related U.S. Application Data

(62) Division of application No. 09/246,220, filed on Feb. 8, 1999, now Pat. No. 6,264,862.

(30) Foreign Application Priority Data

Dec. 31, 1998 (TW) .......................................... 87121965

(51) Int. Cl.⁷ .............................. B23K 1/00; B23K 31/00
(52) U.S. Cl. ..................................... 228/33; 228/248.5
(58) Field of Search .............................. 228/33, 248.1, 228/248.5

(56) References Cited

U.S. PATENT DOCUMENTS

| | | | | |
|---|---|---|---|---|
| 5,038,466 A | * | 8/1991 | Marozsan et al. | 29/840 |
| 5,364,011 A | * | 11/1994 | Baker et al. | 228/180.21 |
| 5,714,086 A | * | 2/1998 | Osuna, Jr. et al. | 252/182.18 |
| 5,772,106 A | * | 6/1998 | Ayers et al. | 228/254 |
| 5,929,141 A | * | 7/1999 | Lau et al. | 523/458 |
| 6,073,817 A | * | 6/2000 | Jairazbhoy | 222/595 |
| 6,224,180 B1 | * | 5/2001 | Pham-Van-Diep et al. | 347/2 |
| 6,234,077 B1 | * | 5/2001 | Ball | 101/129 |
| 6,253,957 B1 | * | 7/2001 | Messerly et al. | 222/1 |
| 6,289,803 B1 | * | 9/2001 | Ball | 101/123 |

* cited by examiner

Primary Examiner—Tom Dunn
Assistant Examiner—Zidia Pittman
(74) Attorney, Agent, or Firm—J.C. Patents

(57) ABSTRACT

An apparatus for manufacturing a plug and the manufacturing method. The method includes the following steps. A baseplate located in the bottom of a closed printing chamber is provided. A printed circuit board and a stencil are mounted on the baseplate in sequence. The stencil is aligned to the printed circuit board. An amount of preheated paste is placed on the stencil. A pressure of the closed printing chamber is adjusted to a first pressure. A printing step is performed to form plugs in the printed circuit board. The pressure of the closed printing chamber is adjusted to a second pressure to remove voids trapped in the plugs. The pressure of the closed printing chamber is adjusted to a third pressure. A scraping step is performed to remove the redundant paste.

9 Claims, 3 Drawing Sheets

APPARATUS FOR MANUFACTURING PLUG AND METHOD OF MANUFACTURING THE SAME

CROSS-REFERENCE TO RELATED APPLICATION

This application is a divisional application of, and claims the priority benefit of, U.S. application Ser. No. 09/246,220 filed on Feb. 08, 1999 now U.S. Pat. No. 6,264,862.

BACKGROUND OF THE INVENTION

1. Field of the Invention

The present invention relates to an apparatus and a method of manufacturing a plug. More particularly, the present invention relates to an apparatus and an improved method of manufacturing a plug in a plated-through hole.

2. Description of the Related Art

Plated-through holes (PTH) are widely used in many applications such as printed circuit boards (PCB), Multi-Chip Module-Laminate (MCM-L), ceramic substrates, thick film devices and integrated circuit packaging carriers such as ball grid array (BGA), chip scale package (CSP) and so on.

Solder masks (S/M), epoxies, or conductive pastes such as silver, copper or silver-copper mixed pastes are commonly used to plug the plated-through holes. Currently, a stencil printer is used to form plugs in the plated-through holes.

During the printing step, a stencil is aligned to a printed circuit board. A large amount of paste is applied on the stencil by an operator. A squeegee is used to plug the plated-through holes with the paste. Plugs are formed in the plated-through holes. However, the plugs usually have a problem of void formation, which voids affect the reliability of the packages and decrease the surface uniformity of the plugs.

Because the printing step is performed in atmospheric conditions, air mixes into the paste during the printing step. Bubbles are formed in the paste. Thus, voids are formed in the plug because of air. Further, the paste itself also causes the voids. The paste usually consists of flux and solvent, and is mixed in atmospheric conditions. Air is easily mixed into the paste, so voids are easily formed in the plug when the paste is used to plug the plated-through holes. Furthermore, the paste is applied on the stencil during the printing step, in a large amount. The solvent mixed in the paste continually evaporates. As a result, the viscosity of the paste continuously changes during the printing step. The surface uniformity of the plugs is worse because the paste viscosity continuously increases during the printing step.

SUMMARY OF THE INVENTION

Accordingly, the present invention provides an apparatus for manufacturing a voidless plug, as well as an improved method of manufacturing a voidless plug.

To achieve these and other advantages and in accordance with the purpose of the invention, as embodied and broadly described herein, the invention provides an apparatus for manufacturing a plug. The apparatus includes a closed printing chamber having a baseplate on the bottom of the closed printing chamber. A pressure controlling system is connected to the closed printing chamber. The baseplate includes a heating unit. A paste source tank is located in the closed printing chamber.

To achieve these and other advantages and in accordance with the purpose of the invention, as embodied and broadly described herein, the invention provides a method of manufacturing a plug. The method includes the following steps. A baseplate located on the bottom of a closed printing chamber is provided. A printed circuit board and a stencil are mounted on the baseplate in sequence. The stencil is aligned to the printed circuit board. An amount of preheated paste is placed on the stencil. A pressure of the closed printing chamber is adjusted to a first pressure. A printing step is performed to form plugs in the printed circuit board. The pressure of the closed printing chamber is adjusted to a second pressure to remove voids trapped in the plugs. The pressure of the closed printing chamber is adjusted to a third pressure. A scraping step is performed to remove the redundant paste.

The apparatus and the method according to the invention both avoid forming trapped voids in a plug; the reliability of the packages is thus improved and the surface uniformity of the plug is also improved.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Figure 1:
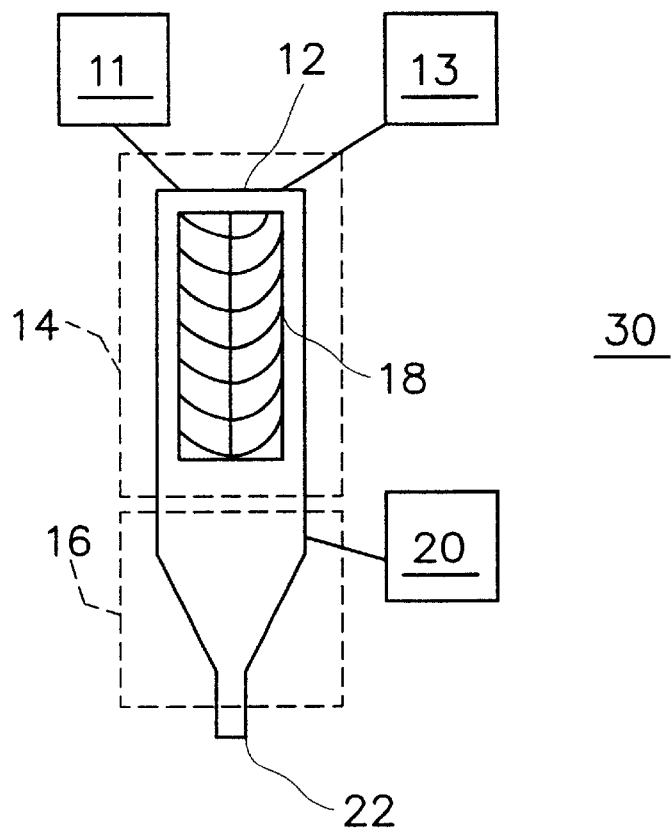
FIG. 1 is a schematic diagram showing a paste-mixing apparatus according to the invention.

Reference will now be made in detail to the present preferred embodiments of the invention, examples of which are illustrated in the accompanying drawings. Wherever possible, the same reference numbers are used in the drawings and the description to refer to the same or like parts.

FIG. 1 is a schematic diagram showing a paste-mixing apparatus according to the invention.

Referring to FIG. 1, a paste-mixing apparatus 30 having a vacuum chamber 12 is provided. The vacuum chamber 12 includes two storage tanks which store paste and solvent, respectively. One is a pre-mixing paste source tank 11 and the other is a solvent source tank 13. The vacuum chamber 12 is maintained at an acceptable degree of vacuum. The vacuum chamber 12 can be divided into two regions. One is a mixing region 14 comprising a mixing apparatus 18 such as a twin screw mixing structure. The other is a storage region 16 comprising a heating unit 20 and an outlet opening 22. The heating unit 20 is used for heating the paste to reduce its viscosity. The heated paste is exported through the outlet opening 22 during the printing step.

The mixing step is performed in the vacuum chamber 12 so that air is not mixed into the paste. The paste is bubble-free. Additionally, the vacuum chamber 12 can prevent the paste from contact with air in the storage step, so the probability of forming voids in the plug during plug formation in the printing step is reduced.

Figure 2:
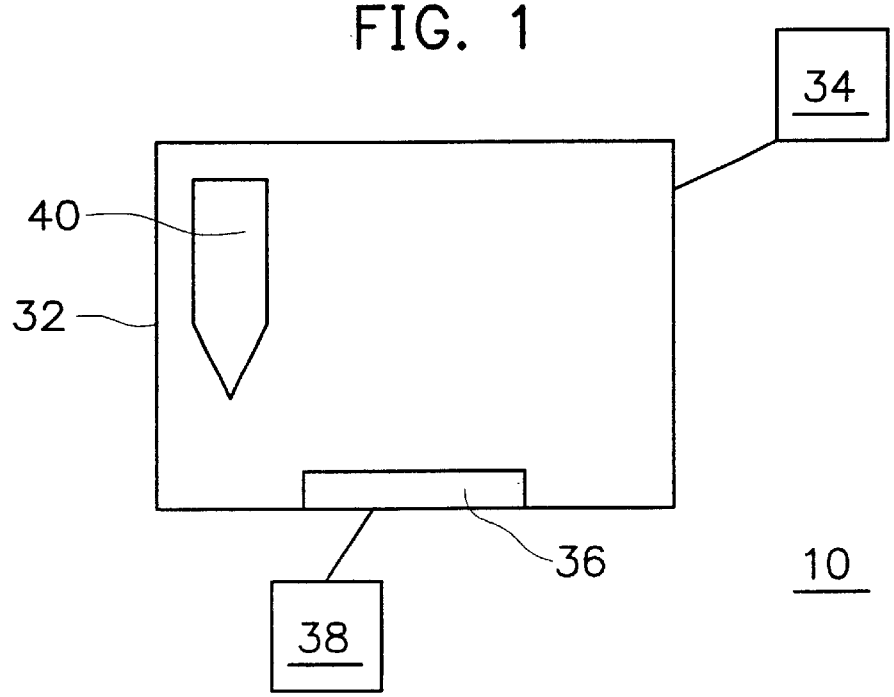
FIG. 2 is a schematic diagram showing an apparatus for manufacturing a plug according to the invention.

FIG. 2 is a schematic diagram showing an apparatus for manufacturing a plug according to the invention.

Referring to FIG. 2, an apparatus 10 for manufacturing a plug comprising a closed printing chamber 32 is provided. The closed printing chamber 32 is an operation region for manufacturing plugs in a printed circuit board. The closed printing chamber 32 is connected to a pressure control system 34 which is used for controlling the pressure of the closed printing chamber 32. A baseplate 36 having a heating unit 38 is located on the bottom of the closed tinting chamber 32. The baseplate 36 is used as a mounting surface for a printed circuit board. The heating unit 38 is used for heating the paste on the printed circuit board mounted on the baseplate 36 during a printing step. A paste source tank 40 for providing paste is located inside the closed printing chamber 32. The preferred paste source tank 40 is the paste-mixing apparatus illustrated in FIG. 1. The paste source tank 40 has functions of mixing and storing the paste in a vacuum. The paste source tank 40 can be a simple container as long as it can provide the paste to the baseplate 36.

Figure 3A:
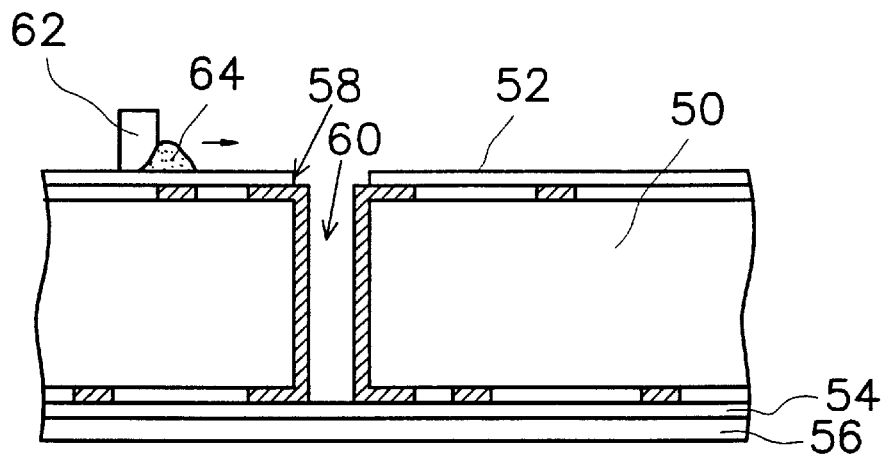
FIGS. 3A through 3C are schematic, cross-sectional views showing the process steps according to the invention for manufacturing a plug.
Figure 3B:
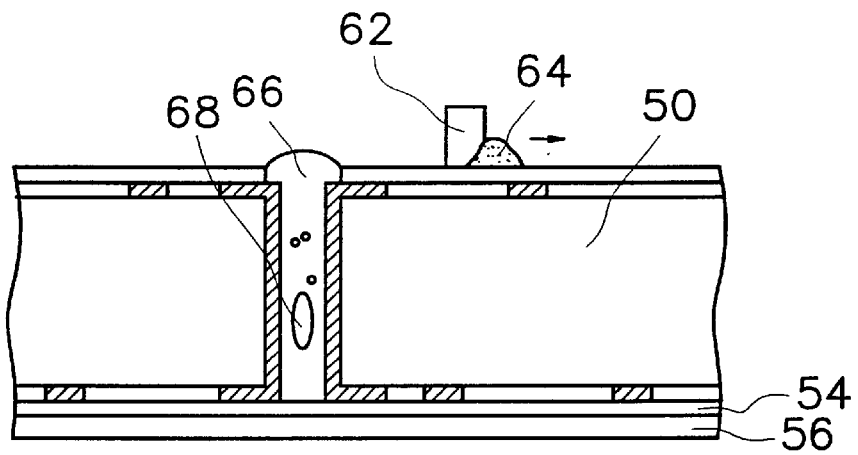
Figure 3C:
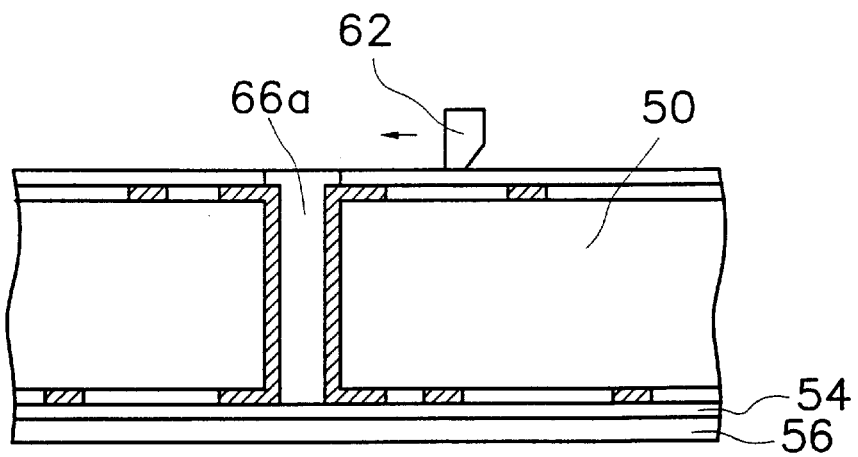

FIGS. 3A through 3C are schematic, cross-sectional views showing the process steps according to the invention for manufacturing a plug.

Referring to FIG. 3A, a printed circuit board 50 having a plated-through hole 60 is mounted on a baseplate 56 located in a closed printing chamber (reference numeral 32 in FIG. 2), wherein a protective film 54 is located between the baseplate 56 and the printed circuit board 50. The baseplate 56 includes a heating unit (reference numeral 38 in FIG. 2). The printed circuit board 50 includes a common printed circuit board or a ball grid array substrate. A stencil 52 having a mesh 58 is mounted on the printed circuit board 50. The mesh 58 is aligned to the plated-through hole 60. An amount of a preheated paste 64 is placed on the stencil 52. The preferred amount of the paste 64 is sufficient for one or two performances of a printing step. The paste 64 is preheated to a temperature of about 40 to 90° C. before it is applied on the stencil 52. The closed printing chamber is pumped down to about 0.01 to 5 Torr, and then a printing step is performed. The paste 64 is heated to a temperature of about 50 to 120° C. by the heating unit of the baseplate 56 during the printing step. A squeegee 62 is used to plug the plated-through hole 60.

The purpose of preheating the paste 64 is to reduce the viscosity of the paste 64 so as to prevent the paste 64 from forming voids when it is used to form a plug in the plated-through hole 60. The purpose of heating the paste 64 during the printing step is the same. The heating temperature depends on the material of the paste 64, and should be just sufficient to reduce the viscosity but not high enough to thermally cure the paste 64. Furthermore, the amount of the paste 64 is reduced to prevent the solvent mixed in the paste 64 from evaporating during the printing step. Thus, the viscosity of the paste 64 is constant for each printing step.

Referring to FIG. 3B, a plug 66 is formed in the plated-through hole 60. Bubbles 68 are formed in the plug 66 because of the viscosity of the paste 64 or the flow of the paste 64. To make sure the bubbles 68 are completely removed, the closed printing chamber is pressurized with air to about 350 to 1000 Torr to introduce a positive pressure. Thus the bubbles 68 are moved to the surface of the plug 66 and broken due to the positive pressure. The positive pressure also helps to densify the plug 66. The process mentioned above is suitable for a low viscous paste whose viscosity is about 200 to 300 Pa.s.

For very high viscous paste 64 whose viscosity is about 600 to 1000 Pa.s, the positive pressure is about 0.5 to 2.0 Kg/cm$^2$ to enhance the efficacy of removing the bubbles 68 trapped in the plug 66. Furthermore, if necessary, the period for which a positive pressure is applied can be lengthened to eliminate the bubbles 68.

Referring to FIG. 3C, the closed printing chamber is pumped down to about 5 to 20 Torr. A squeegee 62 is used to scrape the paste 64. Thus, the redundant paste 64 is removed and the surface uniformity of the plug 66a is improved.

A printed circuit board is illustrated in the preferred embodiment, but the present invention is not limited thereto. The present invention is also suitable for Multi-Chip Module-Laminate and Integrated Circuit Packaging, such as Ball Grid Array, Chip Scale Package and so on.

Figure 4:
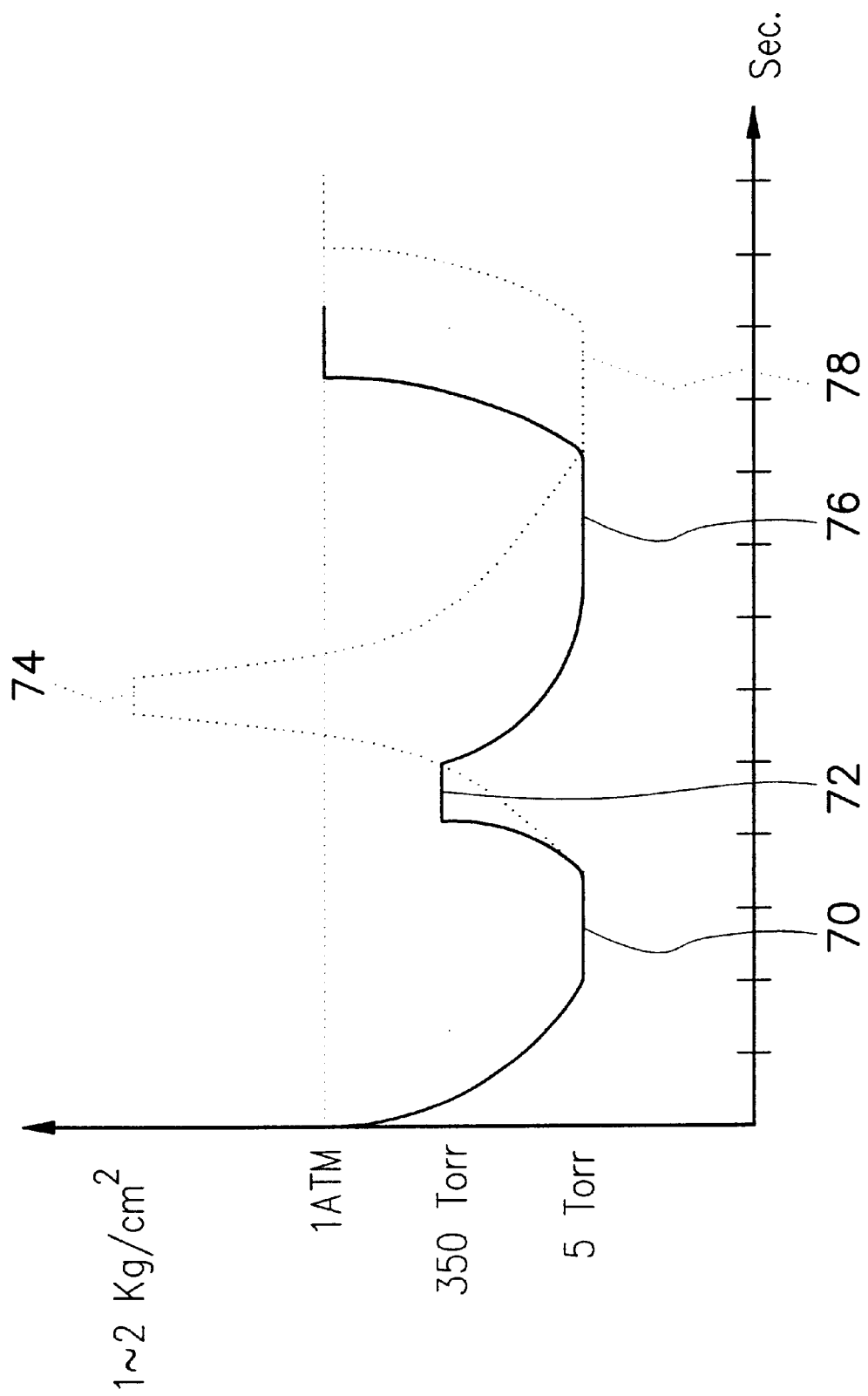
FIG. 4 is a schematic diagram showing the relationship between time and pressure in the manufacturing process of FIGS. 4A through 4C according to the invention.

FIG. 4 is a schematic diagram showing the relationship between time and pressure in the manufacturing process shown in FIGS. 4A through 4C according to the invention.

Referring to FIG. 4, the closed printing chamber is pumped down to around 0.01 to 5 Torr (reference numeral 70 shown in FIG. 4), and the printing step is performed. To make sure the bubbles trapped in a plug are completely removed and to densify the paste, the closed printing chamber is pressurized with air to around 350 to 1000 Torr (as reference numeral 72 shown in FIG. 4) to introduce a positive pressure. Thus, the bubbles are moved to the surface of the plug and broken due to the positive pressure. The closed printing chamber is pumped down to around 5 to 20 Torr (as reference numeral 76 shown in FIG. 4). The squeegee is used to remove the redundant paste and make sure the surface uniformity of the plug. The process mentioned above is suitable for a low viscous paste whose viscosity is about 200 to 300 Pa.s.

For very high viscous paste 64 whose viscosity is about 600 to 1000 Pa.s, the positive pressure is applied to about 0.5 to 2.0 Kg/cm$^2$ (reference numeral 74 shown in FIG. 4) to enhance the efficacy of removing the bubbles trapped in the plug. The printing chamber is then pumped down to around 5 to 20 Torr (reference numeral 78 shown in FIG. 4). The squeegee is used to remove the redundant paste and to ensure the surface uniformity of the plug.

According to the foregoing, the advantages of the invention include the following:

1. The paste is mixed in a vacuum to prevent the paste from contact with air, so that no voids are formed in the plug made from the paste.

2. The present invention provides an improved apparatus for manufacturing a plug, the operation chamber of which apparatus is maintained in a vacuum so that the problem of forming voids in the plug is avoided.

3. The present invention provides an improved method of manufacturing a plug in a vacuum, which can prevent the plug from forming voids. Thus, the reliability of the packages is improved.

4. The heating units are used to heat the paste to reduce the viscosity of the paste, both while exporting the paste from the paste source tank and during printing so that no voids are trapped in the plug.

5. The present invention provides a paste-mixing apparatus to control precisely the amount of paste used during the printing step for preventing waste, as well. The surface uniformity of the plug is improved by using the paste-mixing apparatus because the viscosity of the paste is not changed much.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. An apparatus for manufacturing a plug comprising
    a closed printing chamber;
    a pressure control system connected to the closed printing chamber;
    a baseplate located in the closed printing chamber; and
    a paste source tank located in the closed printing chamber, wherein the paste source tank includes a vacuum chamber having a mixing region and a storage region.

2. The apparatus of claim 1, wherein the mixing region includes a twin screw mixing structure.

3. The apparatus of claim 1, wherein the storage region includes a heating unit and an outlet opening.

4. An apparatus for manufacturing a plug comprising
    a baseplate having a heating unit located in a closed printing chamber; and
    a paste source tank having a vacuum chamber located in the closed printing chamber, wherein the vacuum chamber includes a mixing region comprising a twin screw mixing structure and a storage region comprising a heating unit and an outlet opening.

5. An apparatus for manufacturing a plug comprising
    a closed printing chamber;
    a pressure control system connected to the closed printing chamber;
    a baseplate having a heating unit located in the closed chamber; and
    a paste source tank having a vacuum chamber located in the closed printing chamber, wherein the vacuum chamber includes a mixing region comprising a twin screw mixing structure and a storage region comprising a heating unit and an outlet opening.

6. A paste-mixing apparatus comprising
    two storage tanks, in which one is a pre-mixing paste source tank containing a paste and the other is a solvent source tank containing a solvent;
    a vacuum chamber having a mixing region and a storage region, wherein the storage region includes an outlet opening located at an end of the storage region, and the storage region is connected to the mixing region;
    wherein said two storage tanks supply the paste and the solvent to the mixing region of the vacuum chamber, where the paste and the solvent are mixed.

7. The apparatus of claim 6, wherein the mixing region includes a twin screw mixing structure.

8. The apparatus of claim 6, wherein the storage region includes a heating unit.

9. The apparatus of claim 8, wherein the heating range of the heating unit is about 40 to 90° C.

* * * * *